US009786593B1

(12) United States Patent
Lin

(10) Patent No.: US 9,786,593 B1
(45) Date of Patent: Oct. 10, 2017

(54) SEMICONDUCTOR DEVICE AND METHOD FOR FORMING THE SAME

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/096,265

(22) Filed: Apr. 11, 2016

(51) Int. Cl.
| | |
|---|---|
| *H01L 21/4763* | (2006.01) |
| *H01L 21/44* | (2006.01) |
| *H01L 29/40* | (2006.01) |
| *H01L 23/522* | (2006.01) |
| *H01L 21/768* | (2006.01) |
| *H01L 23/532* | (2006.01) |
| *H01L 23/528* | (2006.01) |
| *H01L 23/00* | (2006.01) |

(52) U.S. Cl.
CPC .... *H01L 23/5226* (2013.01); *H01L 21/76802* (2013.01); *H01L 21/76831* (2013.01); *H01L 21/76877* (2013.01); *H01L 21/76898* (2013.01); *H01L 23/5283* (2013.01); *H01L 23/5329* (2013.01); *H01L 24/11* (2013.01); *H01L 24/13* (2013.01); *H01L 2224/13013* (2013.01); *H01L 2224/13014* (2013.01); *H01L 2224/13025* (2013.01); *H01L 2924/01022* (2013.01); *H01L 2924/01024* (2013.01); *H01L 2924/01029* (2013.01); *H01L 2924/01047* (2013.01); *H01L 2924/01074* (2013.01)

(58) Field of Classification Search
CPC ... H01L 23/481; H01L 23/488; H01L 23/522; H01L 23/5226; H01L 23/535; H01L 21/76898; H01L 21/76879; H01L 21/76877
USPC ......... 257/698, 773, 774; 438/629, 637–640, 438/675
See application file for complete search history.

(56) References Cited

U.S. PATENT DOCUMENTS

| | | | |
|---|---|---|---|
| 6,790,775 B2 | 9/2004 | Fartash | |
| 7,232,754 B2 | 6/2007 | Kirby et al. | |
| 7,238,610 B2 * | 7/2007 | Barns | H01L 21/76879 257/E21.586 |
| 7,701,039 B2 | 4/2010 | Kirby et al. | |
| 9,478,509 B2 * | 10/2016 | Filippi | H01L 24/05 |
| 2006/0289968 A1 | 12/2006 | Sulfridge | |
| 2007/0052067 A1 | 3/2007 | Umemoto | |

(Continued)

FOREIGN PATENT DOCUMENTS

TW         201604991 A      2/2016

*Primary Examiner* — Hsien Ming Lee
(74) *Attorney, Agent, or Firm* — CKC & Partners Co., Ltd.

(57) ABSTRACT

A semiconductor device with a ring structure surrounding a through silicon via (TSV) electrode and a method for forming the same are disclosed. The method includes receiving a substrate including a back side and a front side having a conductor thereon, forming a via hole in the substrate and exposing the conductor, forming a groove extending from the back side into the substrate and surrounding the via hole, forming a first material layer in the via hole, and forming a second material layer in the groove. The groove filled with the second material layer forms the ring structure, while the via hole filled with the first material layer forms the TSV electrode.

15 Claims, 16 Drawing Sheets

(56) References Cited

U.S. PATENT DOCUMENTS

| | | | |
|---|---|---|---|
| 2008/0164573 A1* | 7/2008 | Basker | H01L 21/486 257/621 |
| 2008/0251932 A1 | 10/2008 | Arana et al. | |
| 2009/0191708 A1 | 7/2009 | Kropewnicki | |
| 2014/0300002 A1* | 10/2014 | Na | H01L 23/481 257/774 |

* cited by examiner

30

32 — Receive a substrate comprising a back side and a front side having an interconnect thereon 34 — Form a via hole from the back side of the substrate to penetrate the substrate and expose the interconnect.

36 — Form a groove extending from the back side of the substrate and surrounding the conductor 38 — Form a liner and a seed layer on the back side and sidewalls of the via hole and the groove  (B)

40 — Form a first material layer in the via hole

42 — Form a second material layer in the groove

44 — Form an under bump metallization and a bump over the back side of the substrate

Fig. 3

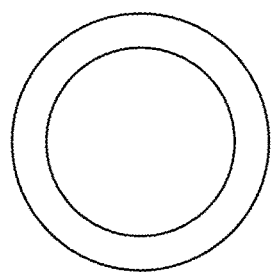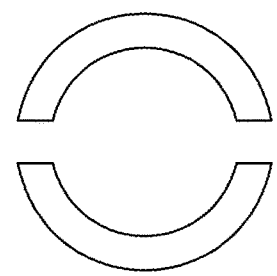
Fig. 10A                Fig. 10B
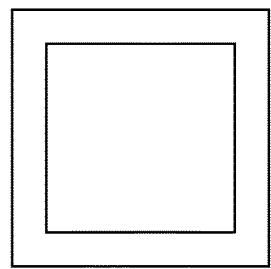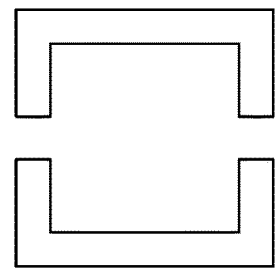
Fig. 10C                Fig. 10D
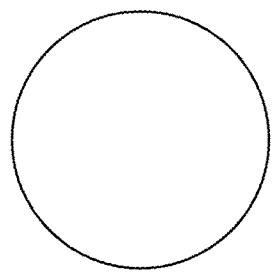
Fig. 11A                Fig. 11B

SEMICONDUCTOR DEVICE AND METHOD FOR FORMING THE SAME

BACKGROUND

With the increasing demand for pursuing higher performance in semiconductor industries, the package technology has been evolved from two-dimension (2D) to three-dimension (3D) wafer package, so as to further improve the density and performance of circuits in an integrated circuit devices.

In the 3D wafer package, two wafers are bonded with conductive pads, and through silicon via (TSV) electrodes are then formed to interconnect conductive pads on the first and second wafers. The TSV electrode is usually made of copper or other conductive material to provide electrical connections between conductive pads. However, due to a large mismatch of coefficients of thermal expansion (CTEs) between copper, or other conductive material of the TSV electrode, and silicon of a substrate surrounding the TSV electrode, structural instability and some defects may occur owing to a thermal stress induced by the large mismatch of CTEs. Thus, further improvements are needed to solve the aforementioned problems and enhance performance of semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a flow chart of an exemplary method for forming a semiconductor device in accordance with some embodiments.

FIGS. 10A through 11B illustrate shapes of a semiconductor element in a top-down view.

DETAILED DESCRIPTION

Figure 1:
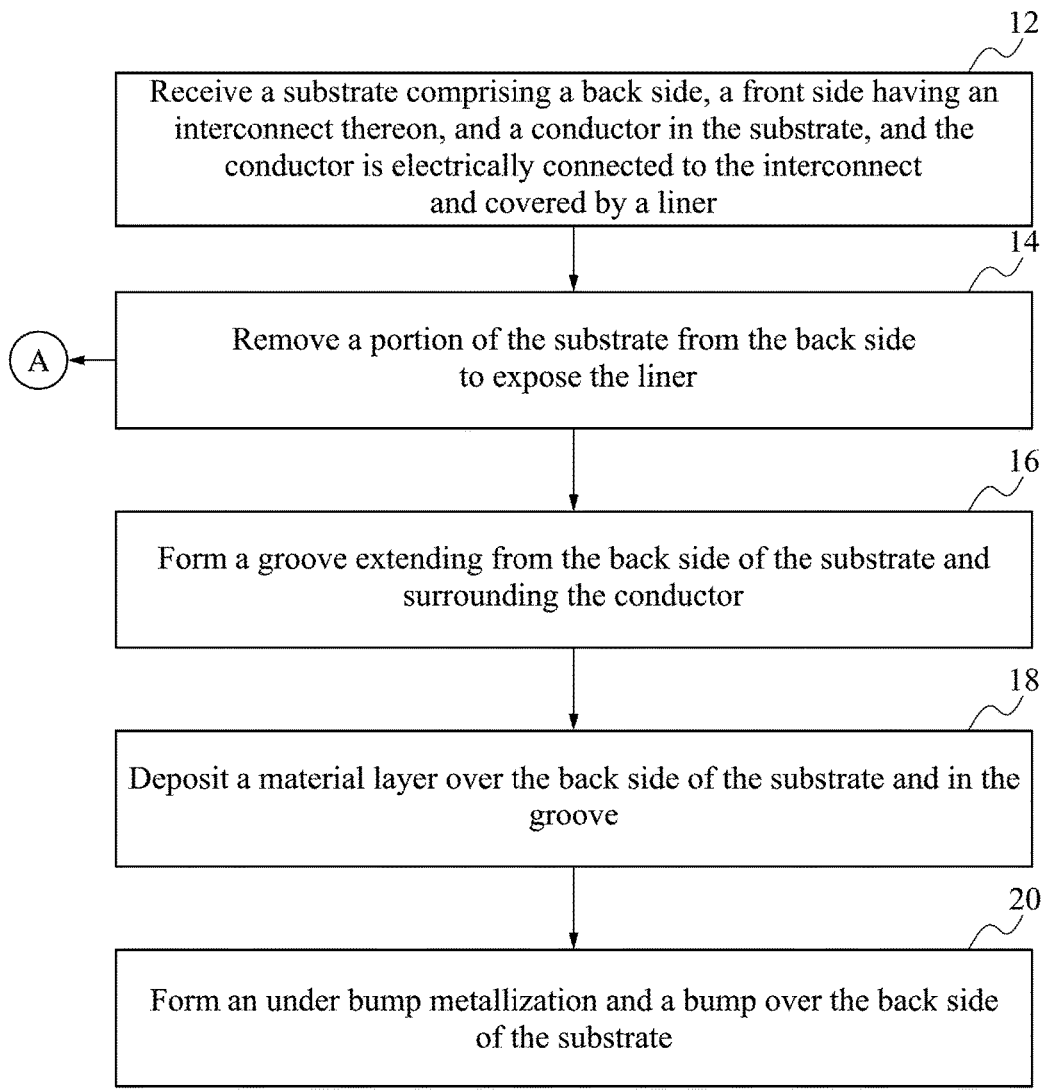
FIG. 1 illustrates a flow chart of an exemplary method for forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

In the manufacture of a semiconductor device, it is very important for a semiconductor device to operate in a stable condition, thus any possibility of causing mechanical instability should be avoided. In a semiconductor device, one of such mechanical instability may occur between a through-silicon via (TSV) electrode and adjacent semiconductor substrate. Usually, large mismatch of coefficients of thermal expansion (CTEs) between the TSV electrode and the semiconductor substrate may lead to delamination of the TSV electrode so as to decrease mechanical stability and electrical performance of the semiconductor device.

To be more precise, in a traditional semiconductor device, the TSV may be filled with copper or other conductive material to form a TSV electrode providing an electrical connection between conductive elements, such as circuits, transistors, and interconnects, on surfaces at opposite sides of a substrate or between two dies. It should be noticed that copper, or other conductive metals, has a much higher coefficient of thermal expansion (CTE) than a CTE of silicon. For example, copper has a CTE value of about 16.5 ppm/° C., whereas silicon has a CTE value of about 2.6 ppm/° C. Such a high CTE mismatch may result in significant thermal stress between the silicon and copper after copper deposition, or during subsequent thermal process, such as solder reflowing, testing, or using. In addition, the thermal stress may be further magnified when adjacent TSV electrodes become closer. The aforementioned thermal stress may cause numerous problems, such as thin-film delamination, cracking of the semiconductor substrate, and decreased semiconductor device performance.

To solve the problem of mechanical instability of a semiconductor device caused by the thermal stress between the semiconductor substrate (e.g., silicon substrate) and the TSV electrode (e.g., copper TSV electrode), a method is provided to decrease the thermal stress between the semiconductor substrate and the TSV electrode. In the method, a ring structure is disposed in a back side, contrary to a front side having circuits thereon, of the semiconductor substrate and around the TSV electrode. The ring structure can be either physically connected to the TSV electrode or apart from the TSV electrode. Furthermore, the ring structure comprises a material which can be either an insulating material or a conductive material. In addition, the ring structure can be either integrated with other back side layers (e.g., under bump metallization or bump) or composed of a material different from the back side layers. With the ring structure, the aforementioned thermal stress between the TSV electrode and the semiconductor substrate or between close TSV electrodes can be decreased or release so that problems of cracks or delamination may be solved.

In the disclosure, there are six semiconductor devices 100, 150, 200, 300, 400, 500 and methods 10, 30, 50, 60, 80 for forming the same are described in six embodiments respectively. The difference between the semiconductor devices 100, 150, 200, 300, 400, 500 may be one of the following factors or a combination thereof: the relationship between the ring structure and the TSV (physically connected or apart); the material filled in the ring structure (conductive or insulating); the relationship between the ring structure and other back side layers (integrated or separated). It should be noticed the description of the embodiments contained herein should not be used to limit the spirit and scope of the claims.

In embodiment 1 and embodiment 2, semiconductor devices 100 and 150 (FIGS. 2D and 2E) are formed from a substrate (FIG. 2A) with an existed conductor, such as a front side through silicon via (TSV) electrode, therein by an embodiment method 10 (FIG. 1). The semiconductor devices 100 and 150 comprise a ring structure physically connected to a TSV electrode in the substrate. Now, the embodiment 1 is described in the following first.

Embodiment 1

Figure 2A:
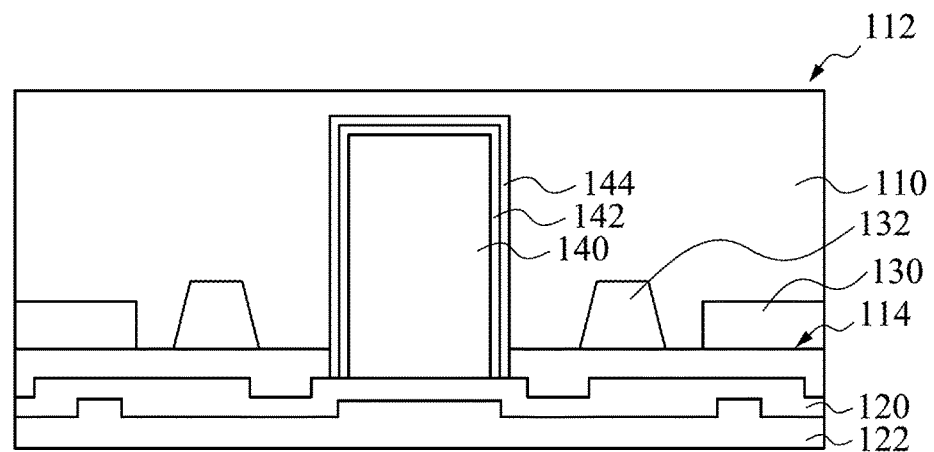
FIGS. 2A through 2E illustrate cross-sectional views of a semiconductor device at different stages of manufacturing processes in accordance with some embodiments.

Referring to FIG. 1 and FIG. 2A, the method 10 starts from step 12 by receiving a substrate. As shown in FIG. 2A, a substrate 110 comprises a front side 114 and a back side 112, wherein the front side 114 further comprises a transistor 130, a shallow trench isolation (STI) 132, an interlayer dielectric (ILD) 122, and an interconnect 120. Furthermore, a conductor 140 electrically connected to the interconnect 120 is disposed in the substrate 110.

Still referring to FIG. 2A, the substrate 110 may be a bulk silicon substrate. Alternatively, the substrate 110 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrates 110 may also include a silicon-on-insulator (SOI) substrate. Generally, au SOI substrate comprises a layer of a semiconductor material such as silicon (Si), germanium (Ge), silicon germanium (SiGe), silicon germanium on insulator (SGOI), or a combination thereof.

In addition, the transistor 130 may comprise a gate electrode, a source/drain region, lightly doped drain (LDD) region, a N-well, a P-well, and a combination therein. For example, the N-well may include n-type dopants, such as phosphorus (P), arsenic (As), antimony (Sb), bismuth (Bi), selenium (Se), tellurium (Te), and a combination thereof. While, the P-well may include p-type dopants, such as boron (B), boron difluoride ($BF_2$), and a combination thereof. For simplicity, a plurality of aforementioned structures in the transistor 130 is not illustrated and described in the disclosure.

Furthermore, the interconnect 120 and the conductor 140 may be any suitable conductive element in a semiconductor device. For example, the interconnect 120 and the conductor 140 may be, but not limited to, an interconnect, a poly silicon gate, a metal gate, a contact, a front side through silicon via (F/S TSV) electrode, and a combination thereof. In the embodiment, the conductor 140 is the front side TSV electrode which is already existed before forming the ring structure which will be described later. The material of the interconnect 120 and the conductor 140 varies with a function thereof. Generally, the material of the interconnect 120 and the conductor 140 are respectively selected from a group consisting of silver (Ag), copper (Cu), tungsten (W), titanium (Ti), tantalum (Ta), aluminum (Al), nickel (Ni), ruthenium (Ru), palladium (Pd), platinum (Pt), Manganese (Mn), tungsten nitride (WN), titanium nitride (TiN), tantalum nitride (TaN), aluminum nitride (AlN), tungsten silicide (WSi), molybdenum nitride (MoN), nickel silicide ($Ni_2Si$), titanium silicide ($TiSi_2$), titanium aluminide (TiAl), arsenic (As) doped polycrystalline silicon, zirconium nitride (ZrN), TaC, TaCN, TaSiN, TiAlN, and a combination thereof.

In some embodiments, the semiconductor device 100 further comprises a seed layer 142 over sidewalls and a top surface of the conductor 140 and a liner 144 over sidewalls and a top surface of the seed layer 142, i.e. the conductor 140 is covered by the seed layer 142 and the liner 144. In some embodiments, the seed layer 142 comprises copper or other conductive material. In some embodiments, the liner 144 may comprise any suitable material, such as, for example but not limited to, tetraethylorthosilicate (TEOS), silicon nitride, silicon oxynitride, silicon oxide, and a combination thereof.

Figure 2B:
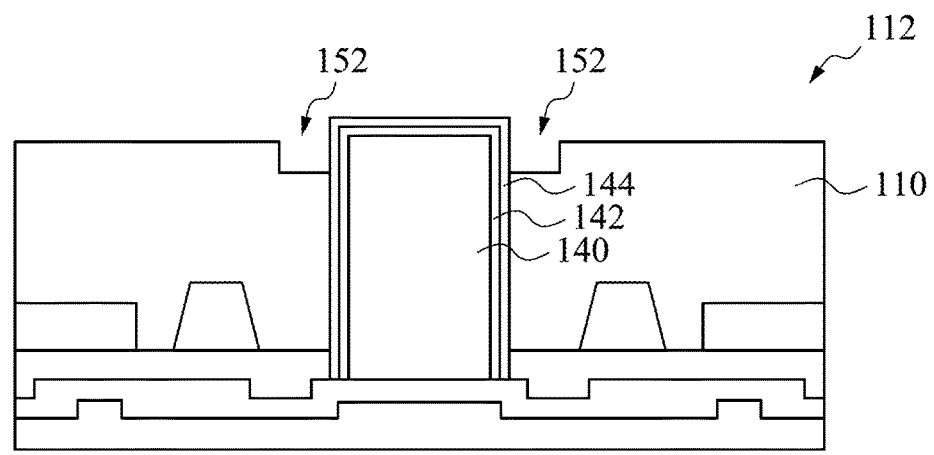

Referring to FIG. 1 and FIG. 2B, the method 10 proceeds to step 14 by thinning down the substrate 110 from the back side 112 to expose the liner 144. The thinning process of the substrate 110 can be any suitable process such as chemical mechanical polishing (CMP), etching, and a combination thereof.

After the liner 144 is exposed, the method 10 proceeds to step 16 by forming a groove 152 from the back side 112 of the substrate 110, wherein the groove 152 is disposed in the substrate 110 surrounding the conductor 140. In some embodiments, a photolithography process is used to form a photoresist mask (not shown) having openings (not shown) and then an etching process, such as wet etching, dry etching, or plasma etching, is used to form the groove 152. The photolithography process may comprise forming a photoresist layer (not shown) over the back side 112 of the substrate 110, exposing the photoresist layer to form a pattern (not shown), performing post-exposure bake processes, and developing the pattern to form the photoresist mask.

As shown in FIG. 2B, the groove 152 has a circular shape in a top-down view (FIG. 10A) and exposes an upper portion of sidewalls of the liner 144. It should be noticed that the groove 152 exposes only an upper portion of sidewalls of the liner 144 rather than entire sidewalls of the liner 144, namely, the groove 152 is formed in an upper portion of the substrate 110 adjacent to the back side 112 instead of penetrating through the substrate 110. In some embodiments, the groove 152 may be composed of several fragments (FIG. 10B). In some embodiments, the groove 152 may have a continuous square shape (FIG. 10C), discontinuous square shape (FIG. 10D), or a polygon shape in a top-down view. In other embodiments, the groove 152 may expose the STI 132.

Figure 2C:
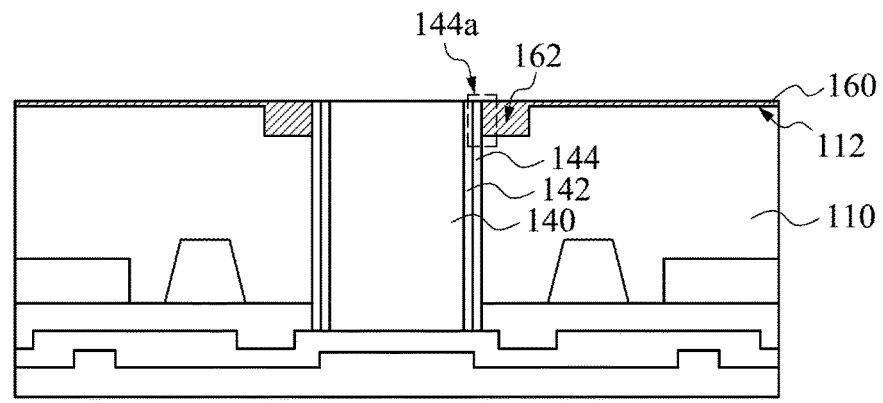

Referring to FIG. 1 and FIG. 2C, the method 10 proceeds to step 18 by depositing an material layer 160 over the back side 112 of the substrate 110, wherein a portion of the material layer 160 is filled in the groove 152 to form a ring structure 162. In some embodiments, the material of the material layer 160 is selected from a group consisting of silicon oxide, silicon nitride, silicon oxynitride, and a combination thereof. In some embodiments, the ring structure 162 is formed by another depositing process and comprises copper, tungsten, other conductive material, or a combination thereof.

After the ring structure 162 is formed, a thinning process, such as chemical mechanical polish, grinding, or etching, is performed to thin down the substrate 110 from the back side 112 to expose the conductor 140 with the ring structure 162 remained at the back side 112 of the substrate 110. As shown in FIG. 2C, the material layer 160 may be deposited over the back side 112 by any suitable process such as, but not limited to, chemical vapor deposition (CVD), physical vapor deposition (PVD), atomic layer deposition (ALD), plasma enhanced chemical vapor deposition (PECVD), and a combination thereof. And the material of the material layer 160 includes silicon oxide, silicon nitride, silicon oxynitride, copper, tungsten, or a combination thereof. It should be noticed that the ring structure 162 is physically connected to au upper portion of sidewalls of the liner 144 (i.e. 144a). Thus, the ring structure 162 can decrease or eliminate the aforementioned thermal stress between the conductor 140 and the substrate 110 during heat treatments so that problems of mechanical instability, such as delamination of the conductor 140 and a crack formed initially formed at the interface between the conductor 140 and the substrate 110 near the back side 112, can be solved.

Figure 2D:
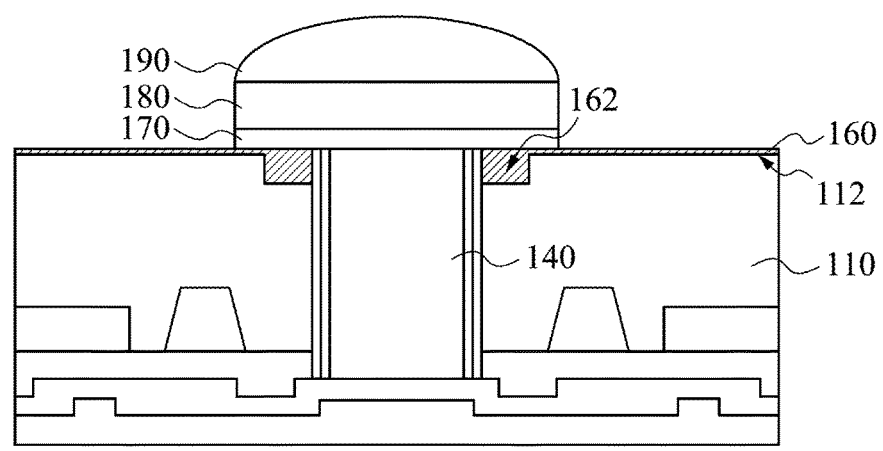

Referring to FIG. 1 and FIG. 2D, the method 10 proceeds to step 20 by forming an under bump metallization (UBM) 170 and a bump 180 over the back side 112 of the substrate 110, wherein the UBM 170 and the bump 180 are electrically connected to the conductor 140. As shown in FIG. 2D, the UBM 170 is formed over the back side 112 of the substrate 110, wherein the UBM 170 covers all the ring structure 162 and the conductor 140. Then, a bump 180 is formed over the UBM 170. Finally, a reflowed solder bump 190 is formed over the bump 180. A semiconductor device 100 having the ring structure 162 is thus formed and a subsequent forming process, such as binding of wafers, may be performed. In some embodiments, the UBM 170 is sputtered or plated over the back side 112 of the substrate 110. In some embodiments, the UBM 170 is composed of a single-layer or a stack of metal layers of different materials selected from a group consisting of chromium (Cr), Titanium (Ti), copper (Cu), silver (Ag), and a combination thereof. In some embodiments, the bump 180 and the reflowed solder bump 190 may be formed over the UBM 170 by any suitable process, such as evaporation, sputter, electroplating, or printing.

Embodiment 2

Figure 2E:
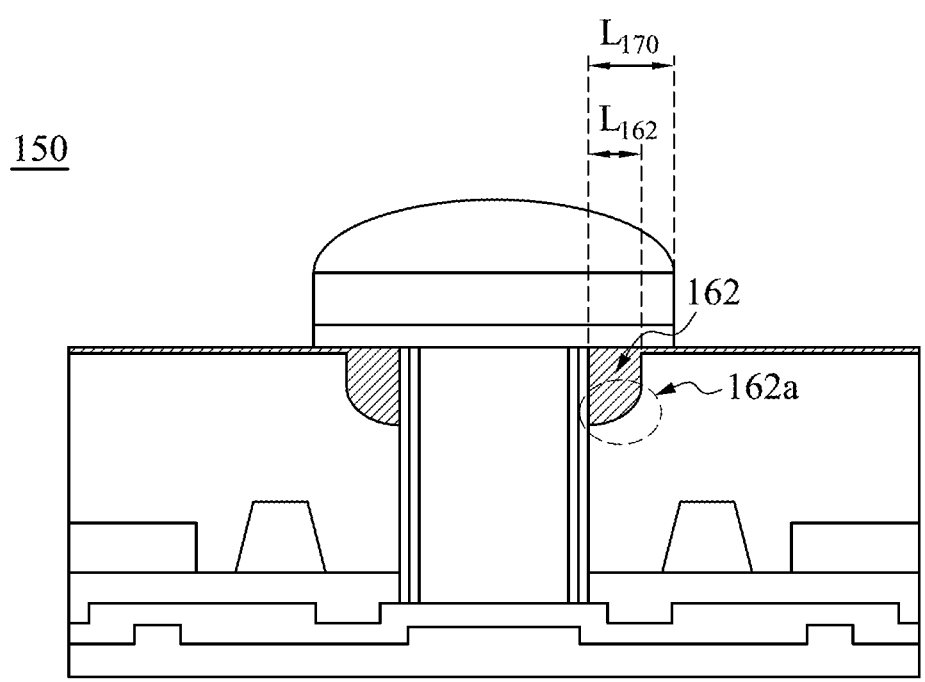

Different from the semiconductor device 100 in embodiment 1, some factors, such as a shape of the ring structure 162, a length (L162) from outer sidewalls of the liner 144 to outer sidewalls of the ring structure 162, and a length (L170) from outer sidewalls of the liner 144 to outer sidewalls of the UBM 170, can be changed to meet design requirements. The above changes can be achieved by adjusting parameters or ways of the aforementioned etching process and depositing process, or performing an additional step, such as an etching process to remove a portion of the UBM 170 to change the L170. For example, the L170 may be smaller than the L162 so that the UBM 170 covers a portion or none of the ring structure 162. In other embodiments, in the semiconductor device 150 as shown in FIG. 2E, the ring structure 162 has an arch shape at a lower portion 162a thereof in cross-sectional view. In addition, the forming method of and material of elements in the semiconductor device 150 are as same as the semiconductor device 100 as described before. It should be noticed that the relationship between the L170 and the L162, and the shape of the ring structure 162 should not be limited to the semiconductor devices 100 and 150 in FIGS. 2D and 2E respectively.

It should be noticed that the ring structure 162 in semiconductor devices 100, 150 can reduce or release the aforementioned thermal stress between the conductor (or called a TSV electrode) 140 and the substrate 110. To be more precise, the interface between the conductor 140 and the substrate 110 of the back side 112 is pushed toward an inner part of the substrate 110 where the aforementioned thermal stress is smaller than the thermal stress near the back side 112. Or, the groove 152 of the ring structure 162 can release thermal stress between the conductor 140 and the substrate 110 to lower the degree of the thermal stress. In some embodiments, the formation of the ring structure 162 (i.e. step 18) is performed at lower temperature, such as 300° C., 200° C., 100° C. or room temperature so that the thermal stress originally occurred between the conductor 140 and the substrate 110 during the cool down process can be released by the groove 152 and the subsequently formed ring structure 162 does not cause the thermal stress again, thus the thermal stress between the conductor 140 and the substrate 110 can be decreased or released.

In embodiment 3, a semiconductor device 200 (FIG. 4E) is formed from a substrate (FIG. 4A) without an existed conductor, such as a front side through silicon via (TSV) electrode, therein by an embodiment method 30 (FIG. 3). The semiconductor device 200 comprises a ring structure apart from a TSV electrode in the substrate, wherein the ring structure comprises with a conductive or an insulating material.

Embodiment 3

Figure 4A:
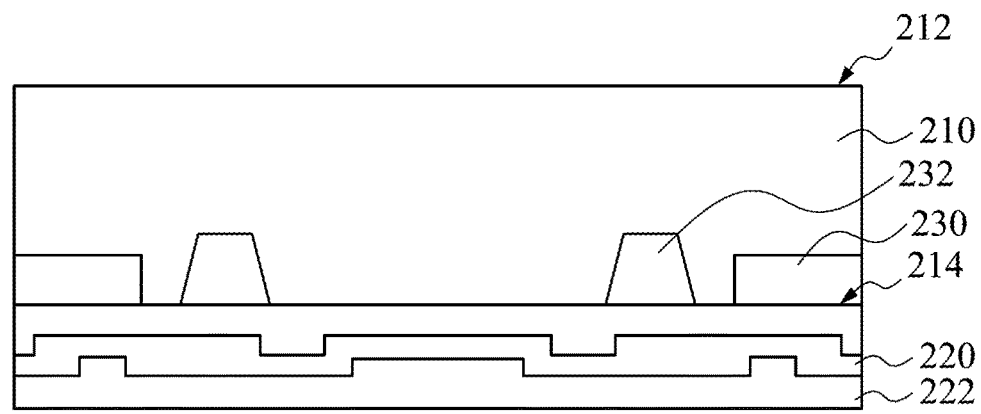
FIGS. 4A through 4E illustrate cross-sectional views of a semiconductor device at different stages of manufacturing processes in accordance with some embodiments.

Referring to FIG. 3 and FIG. 4A, the method 30 starts from step 32 by receiving a substrate 210. As shown in FIG. 4A, a substrate 210 comprises a front side 214 and a back side 212, wherein the front side 214 further comprises a transistor 230, a shallow trench isolation (STI) 232, an interlayer dielectric (ILD) 222, and an interconnect 220. Different from the substrate 110 in FIG. 2A, the substrate 210 does not have a conductor disposed in the substrate 210 and electrically connected to the interconnect 220. Namely, the substrate 210 does not comprise a front side TSV electrode therein. Since the structures or elements related to the substrate 210 are similar to the aforementioned structures or elements of the substrate 110 in FIG. 2A, there is no description here again for simplicity.

Figure 4B:
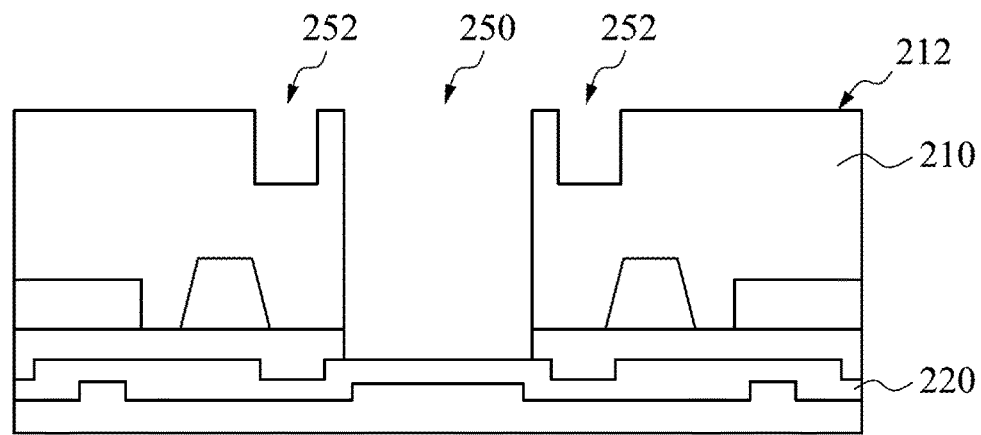

Referring to FIG. 3 and FIG. 4B, the method 30 proceeds to step 34 by forming a via hole 250 in the substrate 210 from the back side 212, wherein the via hole 250 penetrates the substrate 210 and exposes the interconnect 220. Followed by step 36 to form a groove 252 from the back side 212, wherein the groove 252 is disposed in the substrate 210 and surrounding the via hole 250. In the embodiment, step 34 and step 36 are performed meanwhile to form the via hole 250 and the groove 252 meanwhile by a photolithography process and an etching process. The photolithography process and the etching process are similar to the processes for forming the groove 152 in FIG. 2B, so there is no further description here.

Figure 4C:
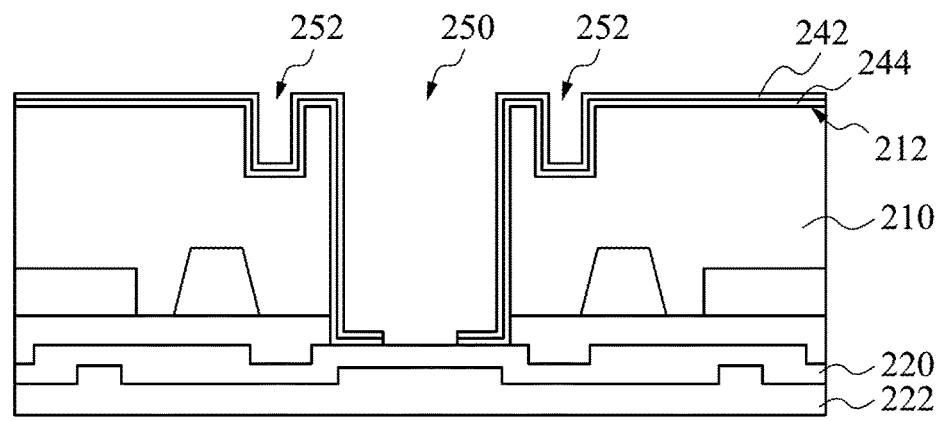

Referring to FIG. 3 and FIG. 4C, the method 30 proceeds to step 38 by forming a liner 244 and a seed layer 242 on the back side 212 of the substrate 210 and sidewalls of the via hole 250 and the groove 252. As shown in FIG. 4C, the liner 244 and the seed layer 242 are deposited over a top surface of the back side 212 and bottom surfaces and sidewalls of the via hole 250 and the groove 252 by any suitable process such as CVD, PVD, PECVD, sputtering, and a combination thereof. It should be noticed that the seed layer 242 is used to improve adherence between the liner 244 and a subsequently formed first material layer. The materials of the liner 244 and the seed layer 242 are similar to the liner 144 and the seed layer 142 in FIG. 2A, thus there is no more description here. Furthermore, a portion of a bottom surface of the via hole 250 is not covered by the liner 244 and the seed layer 242 to allow a subsequent conductive layer filled in the via hole 250 form an electrical connection with the interconnect 220.

Figure 4D:
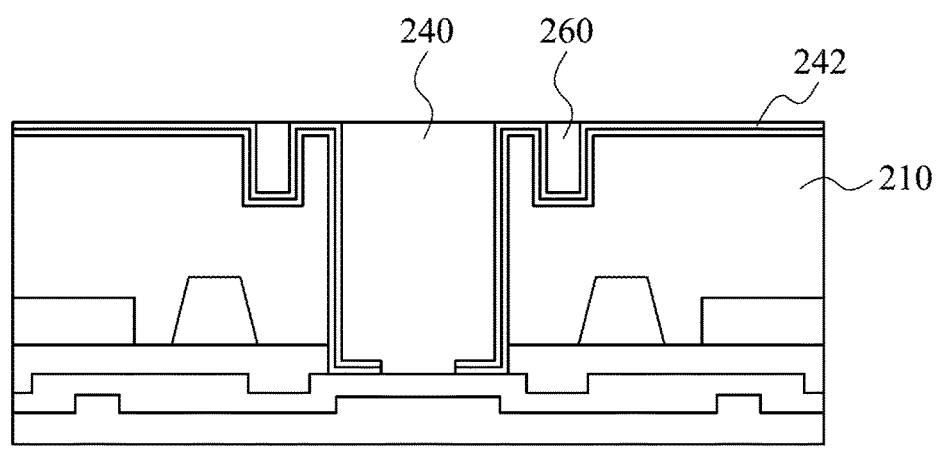

Referring to FIG. 3 and FIG. 4D, the method 30 proceeds to step 40 by forming a first material layer 240 in the via hole 250. Followed by step 42 to form a second material layer 260 in the groove 252. In the embodiment, the first material layer 240 and the second material layer 260 are formed sequentially and made of a material independently selected from a group consisting of titanium (Ti), aluminum (Al), copper (Cu), chromium (Cr), silver (Ag), tungsten (W), silicon dioxide ($SiO_2$), or a combination thereof. In the embodiment, the first material layer 240 is made of a conductive material to form a TSV electrode. The first material layer 240 and the second material layer 260 can be formed by deposition (such as CVD, PVD, PECVD, or sputtering) or epitaxy. In some embodiments, the first material layer 240 and the second material layer 260 are formed meanwhile and made of the same material. In some embodiments, the second material layer 260 comprise a circular or a square shape in a top-down view, which are illustrated in FIG. 10A and FIG. 10C respectively. Furthermore, the circular or the square shape may be discontinuous, which are illustrated in FIG. 10B and FIG. 10D respectively. In other embodiments, the shape of the second material layer 260 in a top-down view may be a polygon shape either in a continuous or a discontinuous form.

Figure 4E:
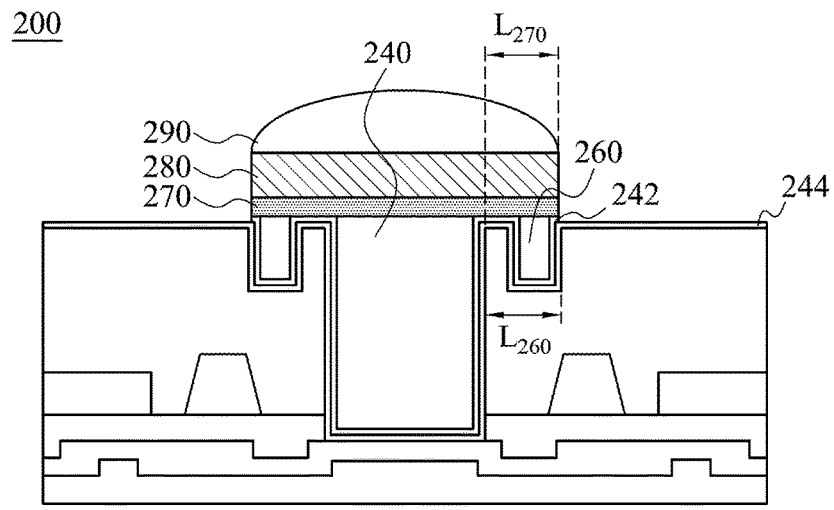

Referring to FIG. 3 and FIG. 4E, the method 30 proceeds to step 44 by forming an under bump metallization (UBM) 270 and a bump 280 over the back side 212 of the substrate 210. As shown in FIG. 4E, the UBM 270 is formed over the back side 212 of the substrate 210, the bump 280 is formed over the UBM 270, and a reflowed solder bump 290 is formed over the bump 280. The materials and forming processes of the UBM 270, the bump 280, and the reflowed solder bump 290 are similar to the UBM 170, the bump 180, and the reflowed solder bump 190 in FIG. 2D. It should be noticed that, before forming the bump 280, a portion of the UBM 270 and/or a portion of the seed layer 242 not covered by the bump 280 may be etched away for preventing short circuit caused by an electrical connection between adjacent UBMs of different TSV electrodes. Or, after forming the UMB 270 and the bump 280, a portion of the seed layer 242 and a portion of the UBM 270 not covered by the bump 280 may be etched away for preventing the aforementioned short circuit. In the embodiment, a length (L260) from outer sidewalls of the liner 244 on sidewalls of the first material layer 240 to outer sidewalls of the second material layer 260 is as same as a length (L270) from outer sidewalls of the liner 244 on sidewalls of the first material layer 240 to outer sides of the UBM 270. In other embodiments, the L260 may be either larger or smaller than the L270. Thus, the semiconductor 200 is formed. In some embodiments, the UBM 270 comprises a circular shape or a square shape in a top-down view, which are illustrated in FIGS. 11A and 11B respectively.

In the embodiment 4 and embodiment 5, semiconductor devices 300 and 400 (FIGS. 6C and 7E) are formed from a substrate without/with an existed conductor, such as a front side through silicon via (TSV) electrode, therein by embodiment methods 50 and 60 (FIGS. 5A and 5B) respectively. The semiconductor devices 300 and 400 comprise a ring structure apart from a TSV electrode in a substrate, wherein the ring structure is integrated with a bump thereon and has an under bump metallization (UBM) between the bump and the substrate.

Embodiment 4

Figure 5A:
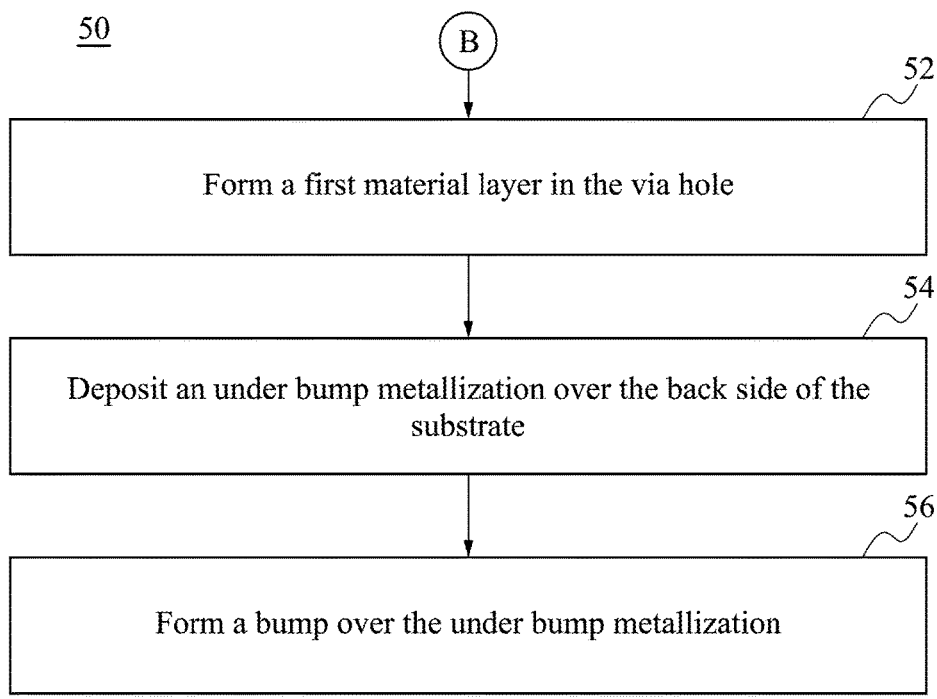
FIG. 5A illustrates a flow chart of an exemplary method for forming a semiconductor device in accordance with some embodiments.
Figure 6A:
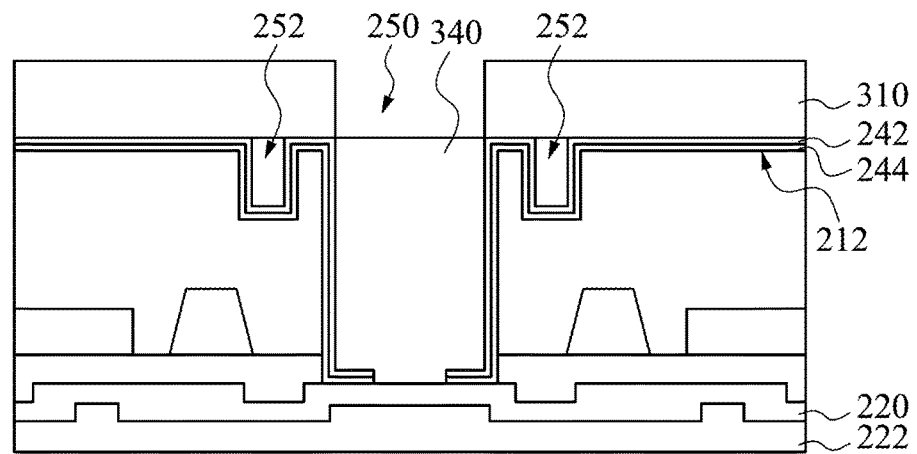
FIGS. 6A through 6C illustrate cross-sectional views of a semiconductor device at different stages of manufacturing processes in accordance with some embodiments.

Referring to FIG. 5A and FIG. 6A, the method 50 proceeds to step 52 from step 38 of the method 30 in FIG. 3, which is marked as "B", by forming a first material layer 340 in the via hole 250 of a semiconductor device in FIG. 4C. As shown in FIG. 6A, before forming the first material layer 340 in the via hole 250, a photoresist mask 310 is formed over the back side 212 of the substrate 210 by the photolithography process mentioned before. The photoresist mask 310 covers the groove 252 and leaves the via hole 250 unfilled, thus a subsequent process, such as deposition or epitaxy, can be performed to form only the first material layer 340 in the via hole 250 and electrically connected to the interconnect 220. After the first material layer 340 is formed, the photoresist mask 310 is removed to expose the groove 252.

Figure 6B:
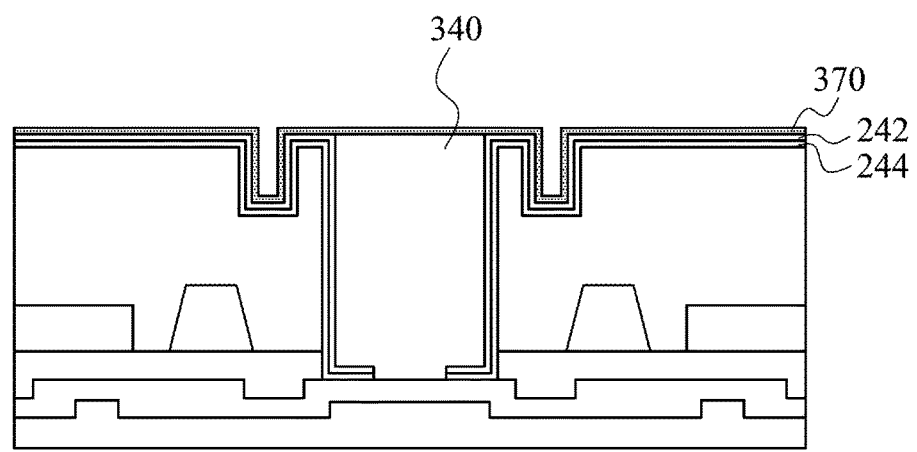

Referring to FIG. 5A and FIG. 6B, the method 50 proceeds to step 54 by depositing an under bump metallization (UBM) 370 over the back side 212 of the substrate 210, wherein the UBM 370 covers sidewalls of the groove 252 as well.

Figure 6C:
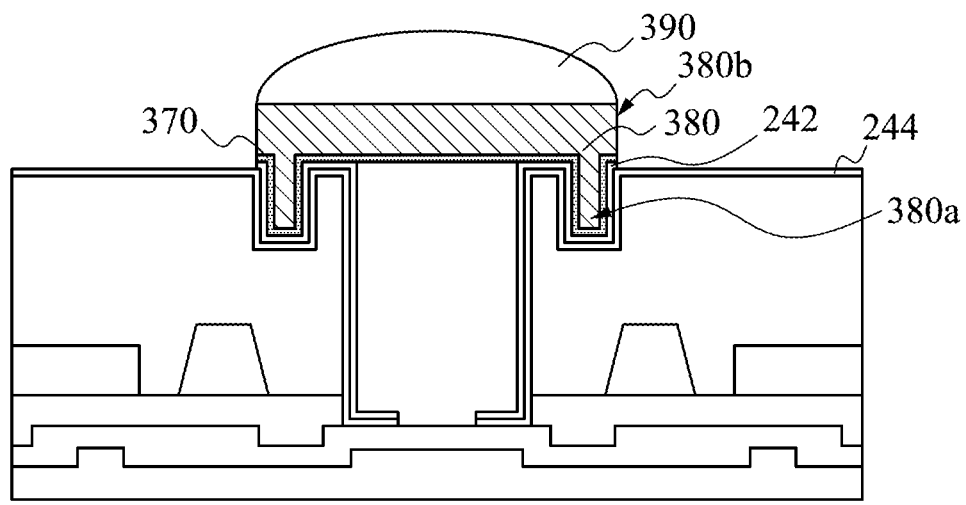

Referring to FIG. 5A and FIG. 6C, the method 50 proceeds to step 56 by forming a bump 380 over the UBM 370, wherein the bump 380 inserts into the groove 252, thus a ring structure (i.e. the groove 252 filled with a portion of the bump 380) is integrated with a bump (i.e. the bump 380). A subsequent process may be applied to form a reflowed solder bump 390 over the bump 380, thus the semiconductor device 300 is formed. It should be noticed that, before forming the bump 380, a portion of the UBM 370 and/or a portion of the seed layer 242 not covered by the bump 380 may be etched away for preventing short circuit caused by an electrical connection between adjacent UBMs of different TSV electrodes. Or, after forming the UMB 370 and the bump 380, a portion of the seed layer 242 and a portion of the UBM 370 not covered by the bump 380 may be etched away for preventing the aforementioned short circuit. Furthermore, the bump 380 comprises a first portion 380a in the groove 252 and a second portion 380b over the back side 212. In some embodiments, the first portion 380a comprise a circular or a square shape in a top-down view, which are illustrated in FIG. 10A and FIG. 10C respectively. Furthermore, the circular or the square shape may be discontinuous, which are illustrated in FIG. 10B and FIG. 10D respectively.

In other embodiments, the shape of the first portion 380a in a top-down view may be a polygon shape either in a continuous or a discontinuous form. In some embodiments, the second portion 380b comprises a circular shape or a square shape in a top-down view, which are illustrated in FIGS. 11A and 11B respectively.

Embodiment 5

Figure 5B:
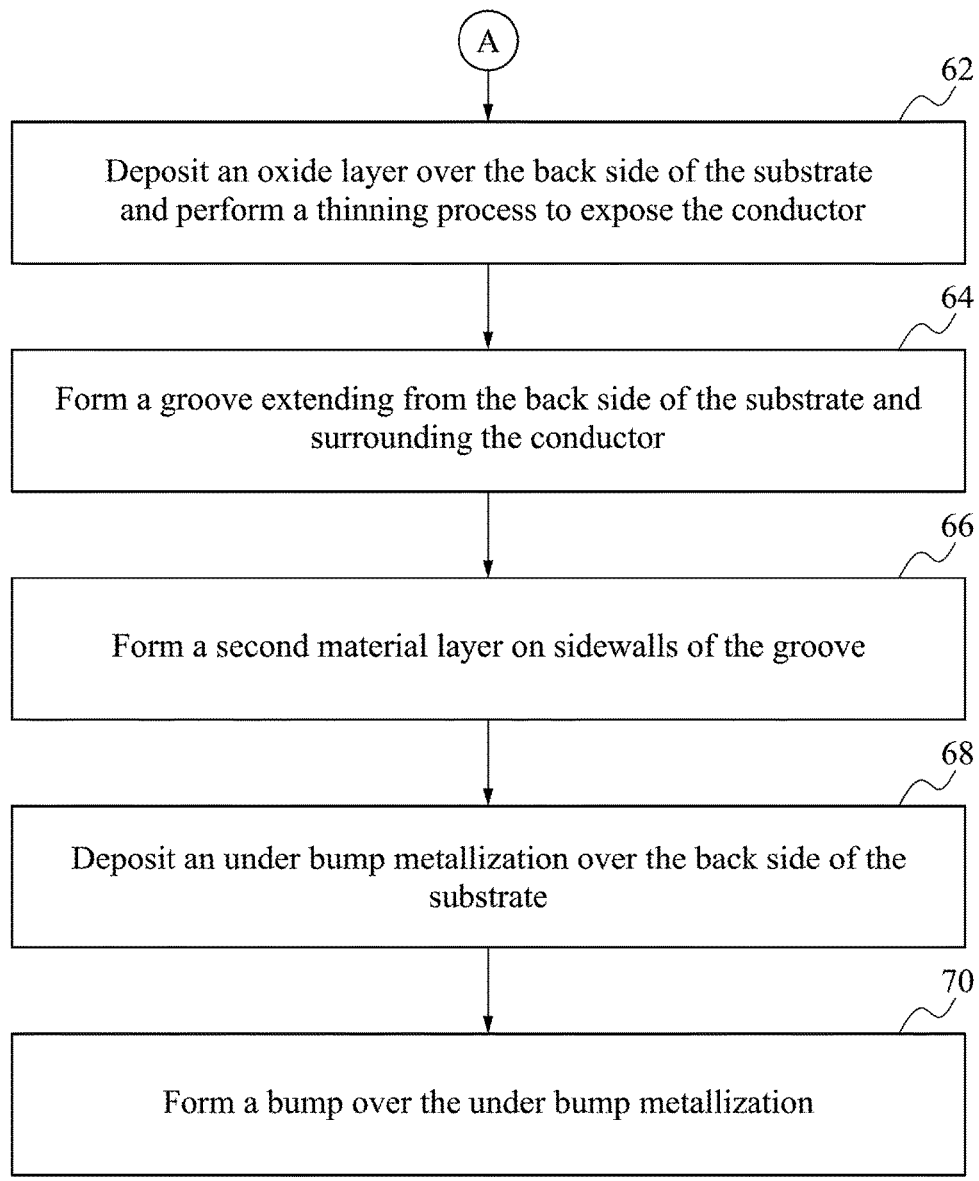
FIG. 5B illustrates a flow chart of an exemplary method for forming a semiconductor device in accordance with some embodiments.

On the other hand, in the embodiment 5, the semiconductor device 400 substantially having a structure substantially as same as the semiconductor device 300 mentioned in the embodiment 4 can be formed from a substrate with an existed conductor, such as a front side through silicon via (TSV) electrode, therein by embodiment methods 60 (FIG. 5B).

Figure 7A:
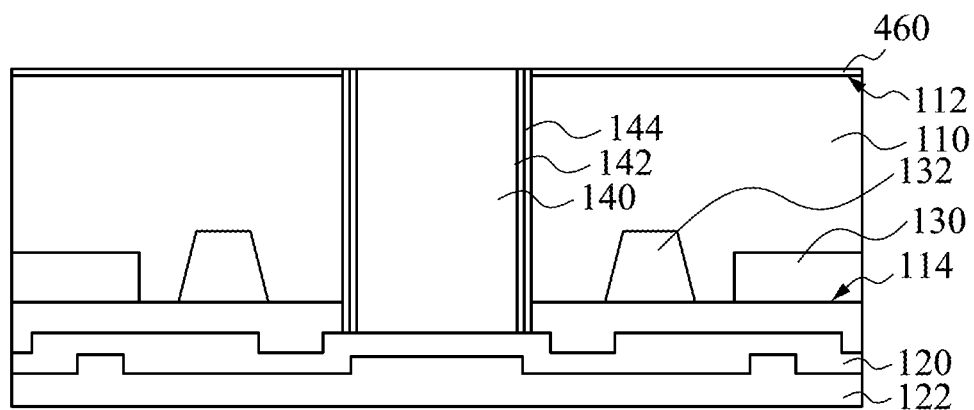
FIGS. 7A through 7E illustrate cross-sectional views of a semiconductor device at different stages of manufacturing processes in accordance with some embodiments.

Referring to FIG. 5B and FIG. 7A, the method 60 proceeds to step 62 from step 14 of the method 10 in FIG. 1, which is marked as "A", by depositing an oxide layer 460 over the back side 112 of the substrate 110 and performing a thinning process to expose the conductor 140. In the embodiment, the oxide layer 460 is formed over the back side 112 and covers the liner 144, followed by a thinning process to remove a portion of the oxide layer 460, a portion of the liner 144 and a portion of the seed layer 142 to expose the conductor 140. In other embodiments, a thinning process is performed to remove a portion of the liner 144 and a portion of the seed layer 142 first to expose the conductor 140, followed by depositing the oxide layer 460 over the back side 112 covering the conductor 140, and then the thinning process is performed again to expose the conductor 140. The aforementioned thinning process may be a chemical mechanical polish process, an etching process, or a combination thereof.

Figure 7B:
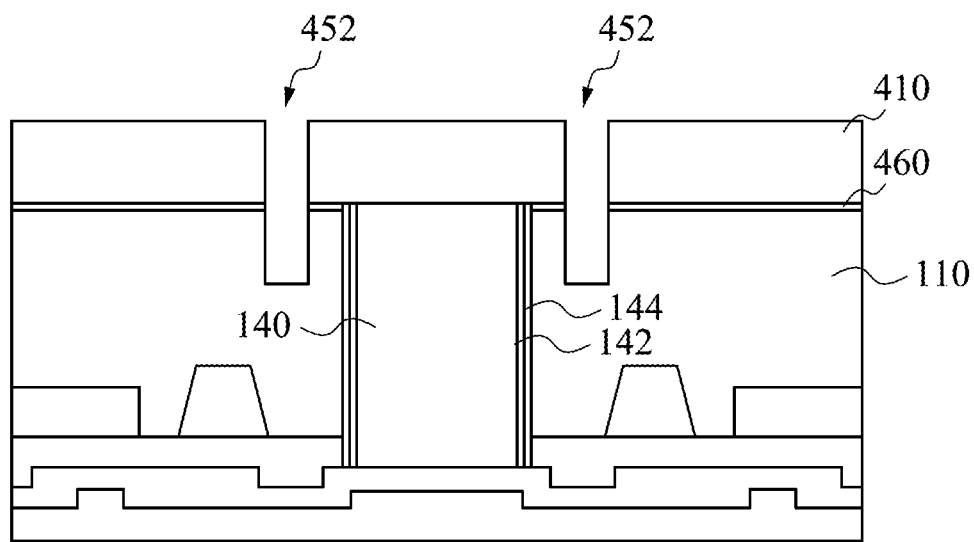

Referring to FIG. 5B and FIG. 7B, the method 60 proceeds to step 64 by forming a groove 452 in the substrate 110 surrounding the conductor 140. As shown in FIG. 7B, a photoresist mask 410 is formed over the back side 112 and covers the oxide layer 460 and the conductor 140, wherein the photoresist mask 410 has an opening (not shown) right over the groove 452. The photoresist mask 410 is formed by the photolithography process mentioned before. Then, an etching process, such as wet etching, dry etching, plasma etching, and a combination thereof, is performed to remove a portion of the oxide layer 460 and the substrate 110 to form the groove 452.

Figure 7C:
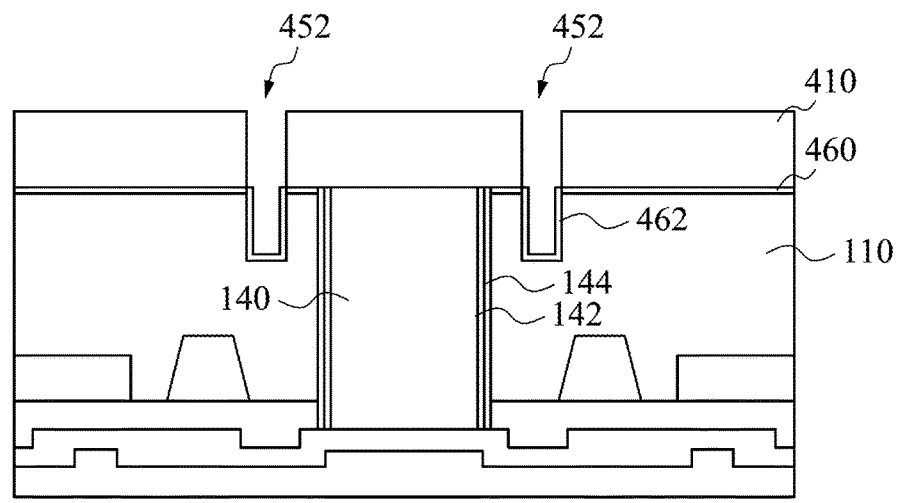

Referring to FIG. 5B and FIG. 7C, the method 60 proceeds to step 66 by forming a second oxide layer 462 on sidewalls of the groove 452. As shown in FIG. 7C, the second oxide layer 462 is physically connected to the oxide layer 460 to form a continuous oxide layer providing a protection for the substrate 110. In the embodiment, the second oxide layer 462 is made of a material as same as the material of the oxide layer 460, thus the oxide layer 460 and the second oxide layer 462 forms an integrated layer. In other embodiments, the second oxide layer 462 may comprise a two-layer structure composed of materials as similar to the seed layer 142 and the liner 144 mentioned before in FIG. 2A.

Figure 7D:
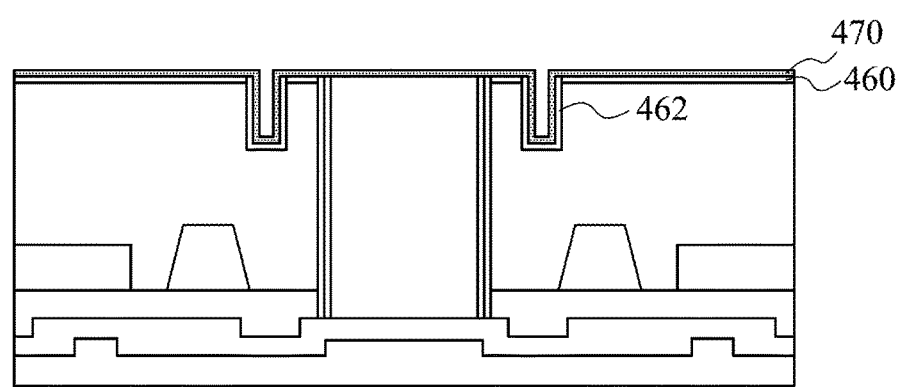

Referring to FIG. 5B and FIG. 7D, the method 60 proceeds to step 68 by depositing an under bump metallization (UBM) 470 over the back side 112 of the substrate 110, wherein the UBM 470 covers sidewalls of the second oxide layer 462 as well.

Figure 7E:
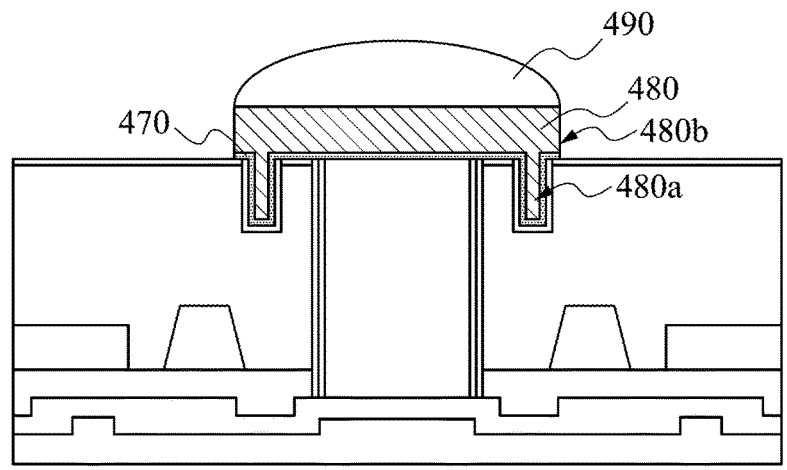

Referring to FIG. 5B and FIG. 7E, the method 60 proceeds to step 70 by forming a bump 480 over the UBM 470, wherein the bump 480 inserts into the groove 452, thus a ring structure (i.e. the groove 452 filled with a portion of the bump 480) is integrated with a bump (i.e. the bump 480). A subsequent process may be applied to form a reflowed solder bump 490 over the bump 480, thus the semiconductor device 400 is formed. It should be noticed that, before forming the bump 480, a portion of the UBM 470 may be etched away for preventing short circuit caused by an electrical connection between adjacent UBMs of different TSV electrodes. Or, after forming the bump 480, a portion of the UBM 470 not covered by the bump 480 may be etched away for preventing the aforementioned short circuit. Furthermore, the bump 480 comprises a first portion 480a in the groove 452 and a second portion 480b over the back side 112. In some embodiments, the first portion 480a comprises a circular or a square shape in a top-down view, which are illustrated in FIG. 10A and FIG. 10C respectively. Furthermore, the circular or the square shape may be discontinuous, which are illustrated in FIG. 10B and FIG. 10D respectively. In other embodiments, the shape of the first portion 480a in a top-down view may be a polygon shape either in a continuous or a discontinuous form. In some embodiments, the second portion 480b comprises a circular shape or a square shape in a top-down view, which are illustrated in FIGS. 11A and 11B respectively.

Embodiment 6

Figure 8:
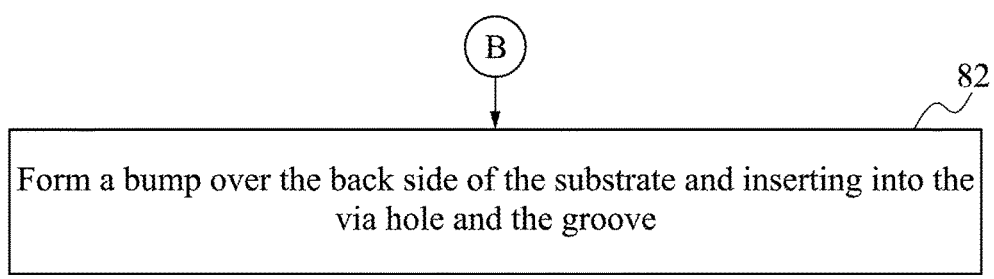
FIG. 8 illustrates a flow chart of an exemplary method for forming a semiconductor device in accordance with some embodiments.

In the embodiment 6, a semiconductor device 500 (FIG. 9B) is formed from a substrate without an existed conductor, such as a front side through silicon via (TSV) electrode, therein by an embodiment method 80 (FIG. 8). The semiconductor devices 500 comprise a ring structure apart from a TSV electrode in the substrate, wherein the ring structure is integrated with a bump thereon without an under bump metallization (UBM) between the bump and the substrate.

Figure 9A:
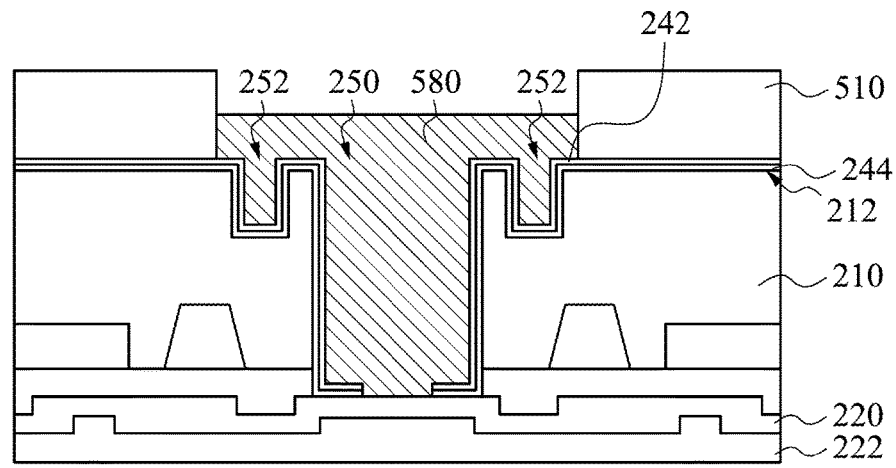
FIGS. 9A and 9B illustrate cross-sectional views of a semiconductor device at different stages of manufacturing processes in accordance with some embodiments.
Figure 9B:
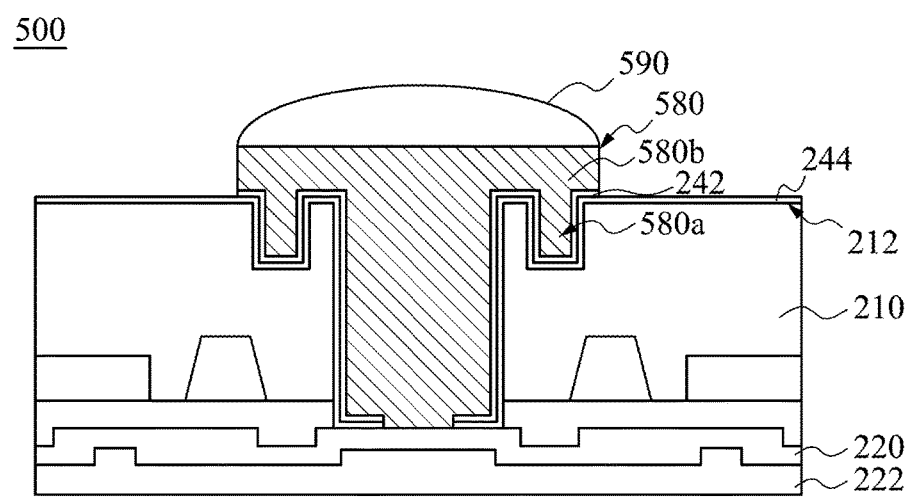

Referring to FIG. 8 and FIG. 9A, the method 80 proceeds to step 82 from step 38 of the method 30 in FIG. 3, which is marked as "B", by depositing a bump 580 over the back side 212 of the substrate 210 and inserting into the via hole 250 and the groove 252 from a semiconductor device in FIG. 4C. As shown in FIG. 9A, a photoresist mask 510 is formed first by the aforementioned lithography process. Followed by a process either in a deposition way or an electrical plating way to form the bump 580 over the seed layer 242 and electrically connected to the interconnect 220. Then, a subsequent process may be applied to form a reflowed solder bump 590 over the bump 580, thus the semiconductor device 500 in FIG. 9B is formed. It should be noticed that, before forming the bump 580, a portion of the seed layer 242 may be etched away for preventing short circuit caused by an electrical connection between adjacent UBMs of different TSV electrodes. Or, after forming the bump 580, a portion of the seed layer 242 not covered by the bump 580 may be etched away for preventing the aforementioned short circuit. Furthermore, the bump 580 comprises a first portion 580a in the groove 252 and a second portion 580b over the back side 212. In some embodiments, the first portion 580a comprises a circular or a square shape in a top-down view, which are illustrated in FIG. 10A and FIG. 10C respectively. Furthermore, the circular or the square shape may be discontinuous, which are illustrated in FIG. 10B and FIG. 10D respectively. In other embodiments, the shape of the first portion 580a in a top-down view may be a polygon shape either in a continuous or a discontinuous form. In some embodiments, the second portion 580b comprises a circular shape or a square shape in a top-down view, which are illustrated in FIGS. 11A and 11B respectively.

It should be noticed that the second material layer 260, first portions 380a, 480a, 580a respectively in semiconductor devices 200, 300, 400, 500 (or called a ring structure) at back side of substrate can weaken the aforementioned thermal stress between the TSV electrode (i.e. the first material layer 240 in FIG. 4D) and the substrate (i.e. the substrate 210 in FIG. 4D). To be more precise, the tensile stress caused by the large mismatch of CTEs between the TSV electrode and the substrate after TSV (i.e. the via hole 250 in FIG. 4C) is formed can be released by the groove (i.e. the groove 252 in FIG. 4C), and then the groove is filled with kinds of materials to form the ring structure.

The embodiments of the present disclosure discussed above have advantages over existing semiconductor devices and processes, and the advantages are summarized below. The semiconductor device of the present disclosure is a novel structure, which applies a ring structure in a substrate surrounding a through silicon via (TSV) electrode at back side of substrate to reduce a thermal stress between TSV electrode and the substrate or between two adjacent TSV electrodes that may cause structural instability, lower performance, or even delamination of the TSV electrode from the substrate. To be more precise, after the TSV is formed, the thermal stress (always are tensile stress) can be released by the groove of the ring structure before filling material therein. Or, after filling material into the groove of the ring structure, the interface between the TSV electrode and the substrate near a back side (i.e. an opposite of a front side having circuits thereon) can be pushed toward an inner part of the substrate where the thermal stress is relatively small. In addition, the ring can be either physically connected to the TSV electrode or apart from the TSV electrode; the material of the ring structure can be either an insulating material or a conductive material; and the ring structure can be either integrated with other back side layers under bump metallization or bump) or composed of a material different from the back side layers.

In accordance with some embodiments of the present disclosure, a semiconductor device comprises a substrate comprising a back side and a front side having a conductor thereon, a via hole penetrating the substrate and exposing the conductor, and a groove extending from the back side into the substrate and surrounding the via hole. The semiconductor device further comprises a first material layer in the via hole and electrically connected to the conductor and a second material layer in the groove.

In accordance with some embodiments of the present disclosure, a method for forming a semiconductor device is provided. The method comprises receiving a substrate comprising a back side and a front side having a conductor thereon, forming a via hole in the substrate and exposing the conductor, forming a groove extending from the back side into the substrate and surrounding the via hole, forming a first material layer in the via hole, and forming a second material layer in the groove.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate comprising a back side and a front side having a conductor thereon;
    a via hole penetrating the substrate and exposing the conductor;
    a groove extending from the back side into the substrate without penetrating the front side, and the groove surrounding the via hole, wherein a first material layer is in the via hole and electrically connected to the conductor, and a second material layer is in the groove; and
    an under bump metallization (UBM) on the second material, wherein a bottom surface of the UBM and top surfaces of the first material layer and the second material layer are coplanar.

2. The semiconductor device of claim 1, further comprising a liner on sidewalls of the via hole.

3. The semiconductor device of claim 2, wherein the second material layer is physically connected to a portion of sidewalls of the liner.

4. The semiconductor device of claim 3, wherein the second material layer comprises silicon oxide, silicon nitride, silicon oxynitride, copper, tungsten, or a combination thereof.

5. The semiconductor device of claim 1, wherein the groove and the via hole are completely separated by a portion of the substrate.

6. The semiconductor device of claim 5, further comprising a second liner on sidewalls of the groove.

7. The semiconductor device of claim 5, further comprising a bump over the back side of the substrate.

8. The semiconductor device of claim 7, wherein the bump, the first material layer, and the second material layer are physically connected to one another and made of a same material.

9. The semiconductor device of claim 5, wherein the first material layer and the second material layer are made of a material independently selected from a group consisting of titanium (Ti), aluminum (Al), copper (Cu), chromium (Cr), silver (Ag), tungsten (W), silicon dioxide (SiO2), and a combination thereof.

10. The semiconductor device of claim 7, wherein the groove and the bump have a shape independently selected from a group consisting of a circular shape, a square shape, and a polygon shape viewed from top.

11. The semiconductor device of claim 1, wherein the conductor is a structure selected from a group consisting of an interconnect, a metal layer, a gate electrode, a front side through silicon via (TSV) electrode, and a combination thereof.

12. A method for forming a semiconductor device, the method comprising:
    receiving a substrate comprising a back side and a front side having a conductor thereon;
    forming a via hole in the substrate and exposing the conductor;
    forming a groove extending from the back side into the substrate without penetrating the front side, and arranging the groove surrounding the via hole;
    forming a first material layer in the via hole;
    forming a second material layer in the groove; and
    forming an under bump metallization (UBM) on the second material layer, wherein a bottom surface of the UBM and top surfaces of the first material layer and the second material layer are coplanar.

13. The method of claim 12, further comprising forming a bump over the back side of the substrate.

14. A method for forming a semiconductor device, the method comprising:
   receiving a substrate comprising a back side and a front side having a conductor thereon;
   forming a via hole in the substrate and exposing the conductor;
   forming a groove extending from the back side into the substrate without penetrating the front side, and arranging the groove surrounding the via hole;
   forming a first material layer in the via hole;
   forming a second material layer in the groove; and
   forming a bump over the back side of the substrate, wherein forming the bump, forming the first material layer and forming the second material layer are and performed meanwhile, and the bump, the first material layer and the second material layer are made of a same material.

15. The method of claim 14, wherein forming the groove is etching a portion of the substrate apart from the via hole.

\* \* \* \* \*